THERMOELECTRIC DEVICE COMPRISING AN OXIDE BASE THERMOELECTRIC ELEMENT

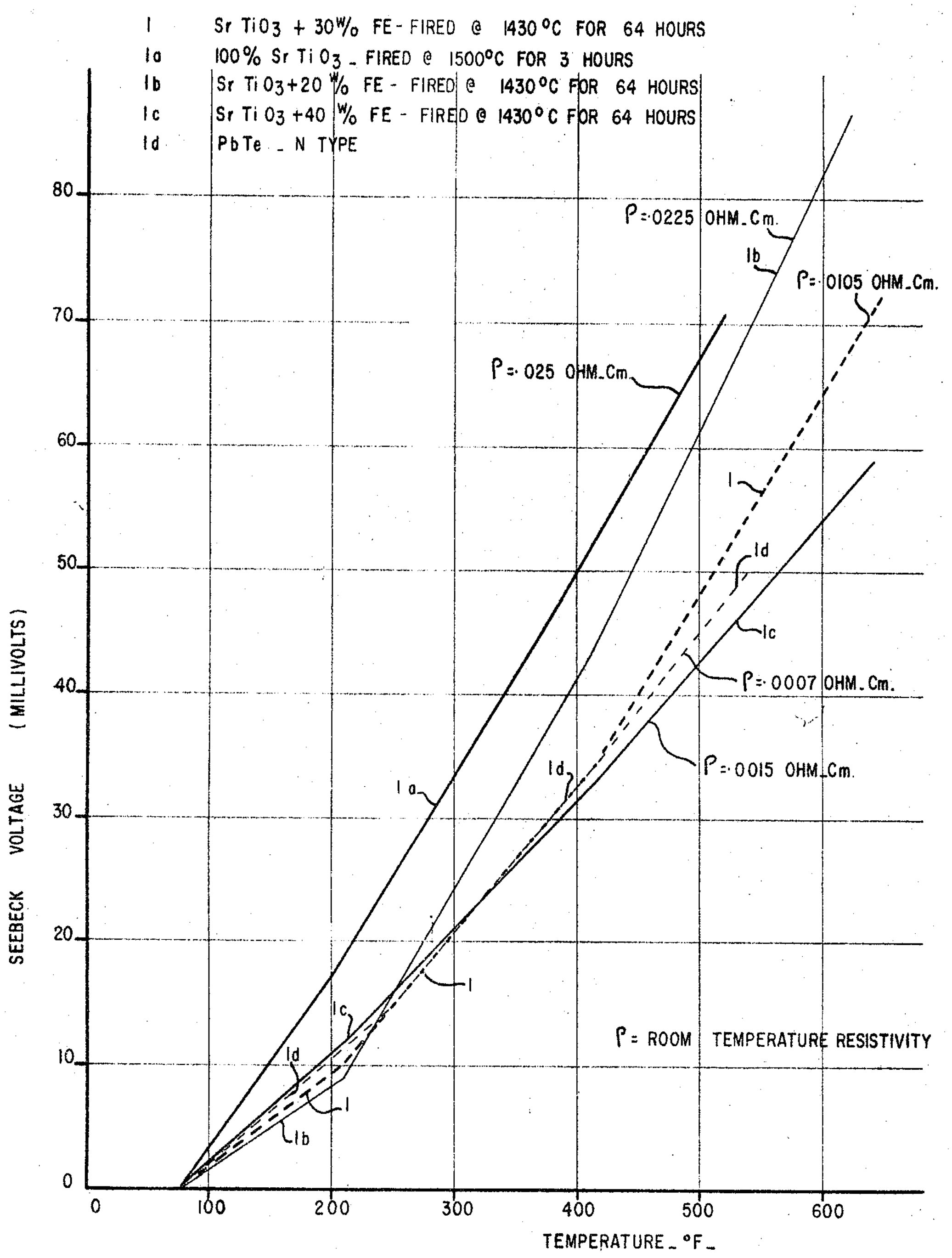
COMPARISON OF Sr Ti O3 ELEMENTS WITH
VARIOUS WEIGHT PERCENTAGES OF Fe - 325 MESH
FIG. I
INVENTOR
WALTER PRECHT
BY
Sughrue, Rothwell, Mion and Zinn
ATTORNEYS July 29, 1969 W. PRECHT 3,458,363

Filed Sept. 11, 1962 2 Sheets-Sheet 2

INVENTOR
WALTER PRECHT

BY

Sughrue, Rothwell, Mion and Zinn

ATTORNEYS

United States Patent Office 3,458,363
Patented July 29, 1969

3,458,363

THERMOELECTRIC DEVICE COMPRISING AN OXIDE BASE THERMOELECTRIC ELEMENT

Walter Precht, Towson, Md., assignor, by mesne assignments, to Teledyne, Inc., Los Angeles, Calif., a corporation of Delaware Filed Sept. 11, 1962, Ser. No. 222,837
Int. Cl. H01v *1/16, 1/28*
U.S. Cl. 136—238 4 Claims This invention relates to thermoelectric elements and more particularly to a thermoelectric element of the mixed-valence compound type of the transition metals employing a pure metal additive.

Thermoelectric elements allow the direct conversion of heat energy to electricity. Extensive activity has been undertaken to provide a thermoelectric couple which could be economically competitive with commercial devices for providing electrical energy. A thermoelectric couple comprises an N-type thermoelectric element electrically joined to a thermoelectric element of opposite conductivity type. Of the three interrelated thermoelectric effects, the Seebeck effect seems to be the most promising. The Seebeck effect describes the voltage produced in a loop of dissimilar conductors when the junctions are maintained at different temperatures. In the production of a practical thermoelectric element, in addition to the Seebeck, the electrical resistivity and the thermal conductivity are factors which must be considered. The thermoelectric value of a substance depends on the three material properties: the Seebeck coefficient, S, expressed in volts per degree centigrade, the specific electrical resistivity, $e$, in ohms-cm., and the specific thermal conductivity, K, expressed in watts/cm. degree K. These are not absolute values but are functions of the temperature. The three characteristics are combined to give a figure of merit Z, which is equal to $S^2/e \cdot K$ for thermoelectric materials. A high value of Z requires a high value of S and low values of $e$ and K.

In the development of the thermoelectric field, semiconductors, such as bismuth telluride and alloys of zinc antimonide and bismuth antimonide have been early favorites since they have relatively high thermal EMF's and have moderately low electrical resistivity and thermal conductivity. While these semiconductors are efficient enough to offer promise for low-temperature thermoelectric power generation, their efficiency drops off at elevated temperatures which limits their applications in power generation. In an effort to provide a thermoelectric element having the same or better efficiency and for operation at elevated temperatures, a class of materials known as "transition metal compounds" have been investigated since they theoretically offer efficient thermoelectric power generation operating in the 2000° F. range. As a result of the investigations, efficiencies in the neighborhood of 10 percent have been reported with an anticipated efficiency in the 20 percent to 30 percent range. The transition metals are a group of elements lying near the center of the periodic table and include such common metals as manganese, iron copper, and nickel. A particular family which shows great promise is the mixed-valence compounds of the transition metals. These compounds are characterized by the presence of ions of the same transition metal with different degrees of electrical charge. Mixed-valence materials in this regard offer several advantages. They are in abundant supply, the cost is relatively low, thermal stability is good, and materials are relatively insensitive to radiation damage or to poisoning by trace impurities. The materials do not require preparation to extremes of purity.

One reported investigation dealt with the manufacture of a mixed-valence compound thermoelectric element in which the base material lead oxide was doped with potassium oxide and bismuth oxide. Unfortunately, the conductivities of the resulting materials generally remained unsatisfactory low, and it was difficult to measure the thermoelectric power because of high resistivity. Interesting enough, one sample of lead oxide doped with bismuth oxide showed an unusually high thermoelectric power on the order of 60,000 microvolts per degree centigrade. The sample's output against copper was about 6 volts, operating on a 100° C. thermal gradient. Its resistivity, however, was $10^{11}$ ohm-cm., and was, therefore, wholly unsuitable for any practical use.

In order to improve the thermoelectric material as well as a choice of the doping material for increasing the Seebeck coefficient, several possibilities exist, including the improvement of the crystal structure and the use of alloying additions to reduce the later's component of thermal conductivity to decrease resistivity.

It is, therefore, a primary object of this invention to provide an improved thermoelectric element and method for making the same formed of mixed-valence compounds of the transition metals having a figure of merit previously unattainable in thermoelectric element of this type.

It is a further object of this invention to provide an improved thermoelectric element of this type and method of making the same having greatly reduced resistivity without impairment of Seebeck and with comparatively low thermal conductivity.

It is a further object of this invention to provide an improved thermoelectric element of this type and method of making the same in which a pure metal is compatibly added to the mixed-valence compound.

It is a further object of this invention to provide an improved thermoelectric element of a non-stoichiometric refractory compound and a method of making the same employing an oxide base to which additions of pure metal powder are compatibly added and in which the end product has a high Seebeck, extremely low electrical conductivity, and acceptacle thermal conductivity.

Further objects and advantages of this invention will become apparent as the following description proceeds, and the features of novelty which characterize this invention will be pointed out with particularity in the claims annexed to and forming a part of the specification.

In general, the product formed by the method of the present invention is a thermoelectric element in the form of a mixed-valence compound of one or more of the transition metals to which is added a pure metal in powder form, the pure metal additive being compatible with the matrix to effect a thermoelectric element having a greatly reduced resistivity without materially effecting the Seebeck. In one specific form, 1 to 40 percent by weight of a pyrophoric iron of one-half micron size is added to 99 to 60 percent strontium titanate. Cold pressing at 5–20 t.s.i. forms the elements into a desired shape. The elements are subsequently sintered in a reducing atmosphere at a controlled rate of stoking at controlled temperature for a predetermined time. In the resultant product, the metal additions are found to be compatible to the oxide base with a ten-fold reduction in resistivity over conventional mixed-valence compounds without material loss of Seebeck.

In the drawings:

FIG. 1 is a graph of the temperature versus Seebeck voltage for strontium titanate showing the effect of various compatible additions of −325 mesh pure iron powder.

Figure 4:
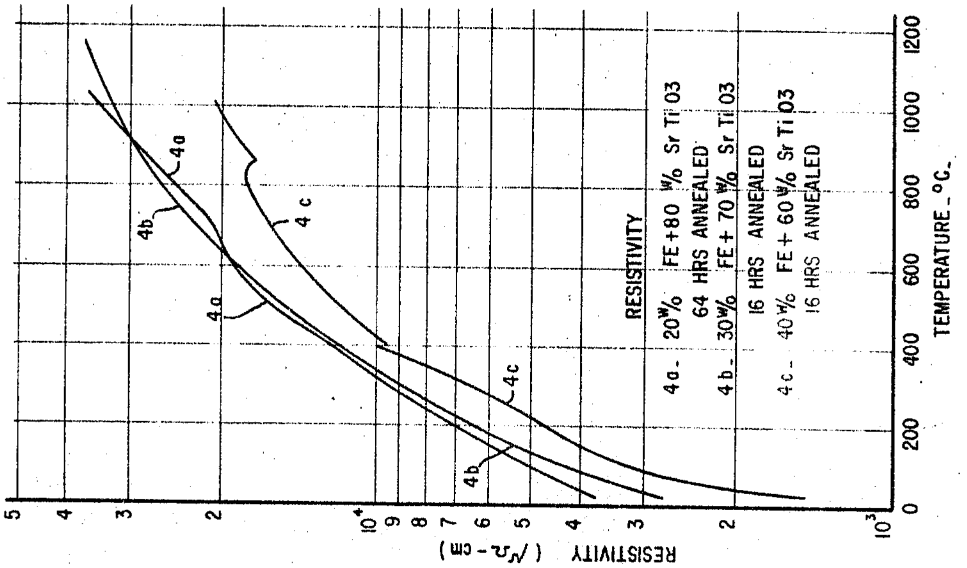
FIG. 4 is a graph of temperature versus resistivity of the thermoelectric elements formed of the compounds of FIG. 3.

This invention is directed to the preparation and use of certain mixed-valence compounds of the transition metals and more particularly of the mixed oxide or reduced titanate family to which pure metal powder is compatibly added with the end product suitable for use as thermoelectric element members.

To provide the thermal compatibility necessary between the metal additions and the oxide or other compound forming the matrix, the following procedure is necessary. The initial reacting materials, which may be in the form of finely divided powders, are thoroughly mixed. For instance, if the metal additive, which may be of a 40 micron size or smaller, is added to the oxide powder, the powders may be mixed in air to effect a good blend, acetone, which is primarily an alcoholic volatile liquid, may be used to form a slurry to insure thorough blending. After a thorough blend has been achieved, the resulting mass is dried and pressed into shape through the use of adequate pressure. For an element having a shape which is approximately a quarter of an inch in diameter and an inch long, a pressure of from 5 to 20 t.s.i. is sufficient. The cold-pressed product is placed in a molybdenum boat and embedded in oxide sand. The critical step resides in controlling the rate of stoking of the boat into a reducing atmosphere furnace. The atmosphere may be hydrogen, for example. The rate of stoking should be sufficiently low to prevent thermal shocking, but should be as rapid as possible. Thus, a rate of stoking just below the shock limit is satisfactory. For instance, for a thermoelectric element which is one-fourth inch in diameter by one inch in length, the stoking rate has been found preferably to be 6 inches per ten minutes or one-half inch per minute. A large sample, for instance, having one-inch diameter and a one-inch length, would require a much lower stoking rate. With the exception of the stoking rate, the sintering is accomplished by normal techniques using temperatures and atmospheres required to yield maximum density and maintain desirable properties for each system used.

It is important to note that if the pressed article is placed at room temperature in the inert atmosphere furnace and then brought to the sintering temperature and allowed to cool in the furnace without the preferred stoking rate, the resistivity value is the same as the mixed-valence compound element to which no metal powder has been added. Apparently, involved in the stoking principle is the formation by the metal additive of a suboxide, which appears to add to the Seebeck or at least does not appreciably detract from the Seebeck while greatly lowering the resistance. The metal additive is compatible with the matrix due to the formation of the suboxide as a boundary phase between the pure metal additive and the matrix. Metal additions up to a practical limit of approximately 40 percent by weight are effective to reduce the resistivity without appreciably reducing the Seebeck even though the loss of Seebeck would seem to be apparent due to the replacement of the matrix with the metal additive. The loss of Seebeck with increasing metal additions can be the result of internal shorting by the metal particles or the high conductivity of the boundary phase between the pure metal additives and the matrix.

The stated examples are exemplary of the teachings of this invention:

Example 1

A mixture of 30 w/o —325 mesh iron powder and 60 w/o ceramic grade stontium titanate in the form of finely divided powders was blended in air with acetone to help in the blending. After blending, the material was dried and compacted cold in the form of a right cylinder, one-fourth inch diameter by one-inch in length, by cold pressing at 5 to 20 t.s.i. The pressed element was then placed in a molybdenum boat and embedded in zirconium oxide sand. The element was stoked at the rate of one-half inch per minute into a hydrogen atmosphere furnace at 1430° C. for 64 hours. The boat was then slowly stoked out of the furnace at a rate sufficient to prevent thermal cracking.

The electrical and thermal properties of the element thus prepared was determined as follows: *e*—electrical resistivity at room temperature=.0105 ohm-cm.; Seebeck voltage at 500° F.=48 millivolts.

Referring to FIG. 1, there is shown graphically the results of Examples 1, 1*a*, 1*b*, 1*c*, and 1*d*, indicating the differences in thermoelectric properties of various examples as a result of the powdered, pure metal additive. The Seebeck voltage in millivolts is plotted along the ordinate axis and against temperature in degrees Fahrenheit along the abscissa. Example 1, which is described briefly above, employs strontium titanate with a 30 percent by weight of —325 mesh iron additive. Three other examples are included to show the unexpectedly large decrease in electrical resistivity as a result of the pure metal additive. Referring to the graph of the example labeled 1*d* is a conventional lead telluride-N-type thermo-electric element. The room temperature resistivity is shown to be .0007 ohm-cm., which is relatively low, but, at the same time, the Seebeck voltage at a temperature of 500° F. is only 45 millivolts. This is contrasted with Example 1*a*, which is formed of 100 percent strontium titanate in which the resistivity is much higher at .025 ohm-cm. The Seebeck voltage output is greatly increased at 500° F. to 67 millivolts. In Example 1*b*, 20 percent by weight of —325 mesh iron is added to the strontium titanate with a slight reduction in resistivity measured at room temperature to .0225 ohm-cm., Seebeck voltage at 500° F. is 62 millivolts. However, in Example 1, with a 30 percent addition of —325 mesh iron powder to the strontium titanate, the resistivity has dropped appreciably to .0105 ohm-cm. or approximately one-half the resistivity of the pure strontium titanate example. At 500° F., the Seebeck voltage output of Example 1 is approximately 48 volts as compared to the 61 millivolts for the 20 percent iron Example 1*b*. In Example 1*c*, 40 percent by weight of —325 mesh iron powder is added to the strontium titanate with a large decrease in room temperature resistivity to .0015 ohm-cm., which is compared to the .0007 ohm-cm. of the conventional lead telluride example. The Seebeck voltage is slightly reduced over the 30 percent example to approximately 43 millivolts at 500° F. but is almost equal to the 45 millivolts output at 500° F. of the conventional lead telluride example.

When the specific resistivity of the 40 percent iron additive example is compared to the pure strontium titanate example in which the resistivity drops from .025 ohm-cm. to .0015 ohm-cm. with only a slight drop in Seebeck voltage, the large increase in the figure of merit for the pure metal additive becomes readily apparent. The explanation of the relatively large Seebeck voltage as a result of the pure metal additive is presently unknown. Certain theories have been advanced including the possibility that the portion of iron acting as a doping agent introduces trapping levels in the forbidden energy band of the titanate, that carrier electrons are temporarily trapped for times comparable to the electron mean free time and that *r* is effectively increased. Another possibility is suggested by the fact that iron is substituted for strontium in the strontium titanate crystals. The iron must then exist as $Fe^{++}$, since it is substituted for $Sr^{++}$. The principal valence of iron is +3 so that $Fe^{++}$ ions may tend to donate electrons to the titanium and oxygen. Such charge exchange processes would increase the electron density without necessarily increasing the electron mobility.

Figure 2:
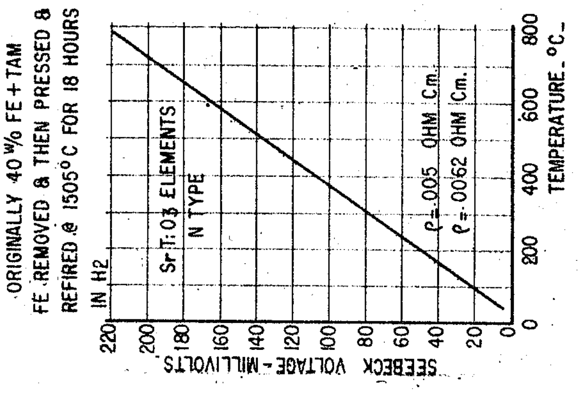
FIG. 2 is a graph of temperature versus Seebeck voltage for a sample comprising strontium titanate in which a 40 percent by weight addition of 325 mesh iron powder is added, the product sintered and the iron powder subsequently magnetically removed prior to the formation of the finished product.

Since the possibility existed that the addition of the pure metal powder in 40 micron size or smaller in the method of the present invention produced a boundary phase which creates compatibility between the pure metal powder particles and the refractory matrix, it was assumed that the great reduction in resistivity without appreciable decreases in Seebeck was the result of the formation of the boundary phase. Based on this supposition, Example 2 was prepared by adding 40 percent by weight of pure iron in the form of —400 mesh iron powder to the strontium titanate in the general manner of Examples 1–1*c*, with the pure metal subsequently removed magnetically after sintering and the remaining powder product pressed and resintered. The thermoelectric properties for this product are shown in the graph of FIG. 2.

Example 2

40 w/o —400 mesh iron powder was blended with 60 w/o ceramic grade strontium titanate. Thorough blending was accomplished while wet with acetone in slurry form, the resultant material was dried and compacted cold (as in Example 1). The pressed element was sintered in hydrogen in a controlled temperature of 1420 to 1500 C. for a period of time between 60 and 80 hours and cooled to room temperature. The resulting element was then crushed and the iron powder was magnetically removed to the point where the strontium titnate powder no longer yielded iron particles or responded to the magnetic field. The remaining strontium titanate and boundary phase material was further ground to particle size of less than one micron. This powder was then pressed as before, and sintered for 18 hours in a hydrogen atmosphere at 1505° C. The electrical and thermal properties of the element thus prepared was determined as follows: P-electrical resistivity at room temperature—.0050 ohm-cm. before test, and .0062 ohm-cm. after test. The Seebeck voltage at 500° F. (260° C.)—68 millivolts.

From a comparison between Examples 1*c* and 2, it is apparent that there is some increase in room temperature resistivity from .0015 ohm-cm. for the strontium titanate with the 40 percent, —325 mesh Fe powder to the 40 percent, —400 mesh iron powder addition of Example 2 wherein the pure iron additive is magnetically removed prior to the formation of the finished thermoelectric element. However, there is some difference in the Seebeck voltage at the same temperature 500° F. In the case of the No. 2 Example in which the pure iron additive is magnetically removed, the Seebeck voltage is 68 millivolts, as compared to the 43 millivolts for the 40 percent pure iron powder additive retained as in Example 1*c*.

In working with the strontium titanate examples, it was noted that in addition to reaching the practical limit as far as the percentage of pure metal additive which could be added without effecting both the Seebeck voltage and the thermal conductivity of the element, which is in the neighborhood of 40 percent by weight, it became apparent thta the particle size of the pure metal powder added to the base material was a factor which was quite important as far as the thermoelectric characteristics of the resulting produc were concerned. Instead of using the relatively large —325 mesh or 40 micron size pure metal powder additions, the utilization of smaller particle size pure metal powder in the pyrophoric range provided even better results insofar as reduction in room temeprature resistivity.

Example 3

A mixture of 20 percent by weight iron of one-half micron size (pyrophoric iron) was added to 80 percent strontium titnate with the material being thoroughly blended while wet with acetone used to form a slurry. The material was dried and compacted cold into a form of a right cylinder at 5 t.s.i. The element shape was .25 inch in a diameter by one inch in length. The pressed elements were placed in a molybdenum boat and embedded in the zirconium oxide sand. The element was stoked into a hydrogen atmosphere furnace at the rate of one-half inch per minute at a temperature of 1430° C. to 1480° C. for time period of 64 hours. The boat was then slowly stoked out of the furnace at a rate sufficient to prevent thermal cracking. The electric and thermal properties are as follows: room temperature resistivity—.003700 ohm-cm. Seebeck voltage at 500° F.—4 millivolts.

Figure 3:
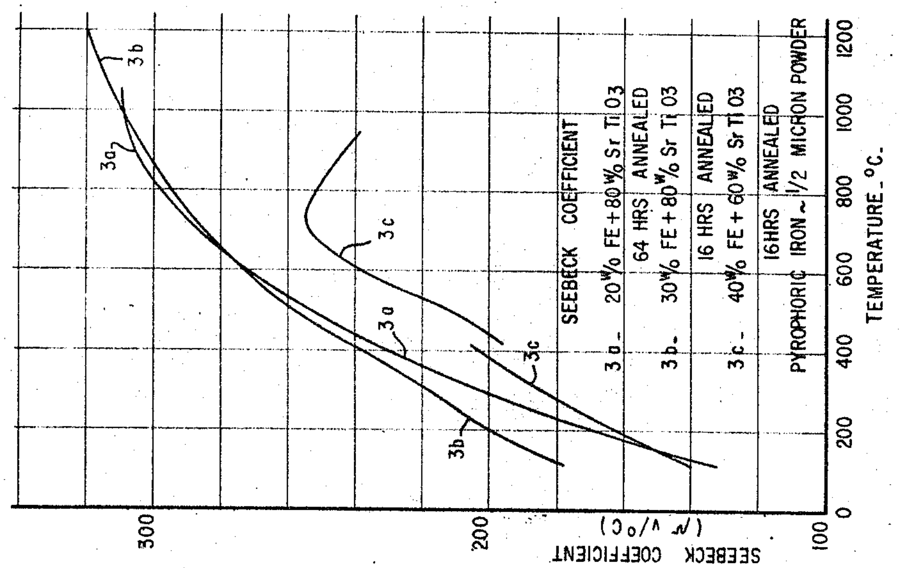
FIG. 3 is a graph of temperature versus Seebeck coefficient of strontium titanate with various percentage additions of pyrophoric iron powder.

From FIGS. 3 and 4, a comparison can be made of Examples 3*a*, 3*b*, and 3*c* with respective 20 percent, 30 percent, and 40 percent by weight additions of pyrophoric iron in one-half micron size. Where the Seebeck voltage at 500° F. or 260° C. is 49 millivolts in Example 3*a* with a 20 percent addition, for the 30 percent addition of Example 3*b*, the Seebeck at 500° F. is increased to 55 millivolts while for the 40 percent addition of Example 3*c*, the Seebeck voltage at this temperature is slightly reduced to 46 millivolts. However, a comparison of the resistivities shows more pronounced changes. Where the room temperature resisivity was .003700 ohm-cm. in the case of the 20 percent pyrophoric iron addition, with the 30 percent pyrophoric iron Example 3*b*, reference to FIG. 4 shows that the room temperature resistivity is in the neighborhood of .002700 ohm-cm. and for the 40 percent pyrophoric iron Example of 3*c*, the resistivity is .000900 ohm-cm.

To show the effect of temperature on resistivity, note from FIG. 4 that the resistivity (measured in micro-ohms per centimeter) varies from $3.7 \times 10^3$ micro-ohm-centimeters at room temperature to $3.4 \times 10^4$ micro-ohm-centimeters at 1000° C. For the 30 percent pyrophoric iron addition, the resistivity varies from $2.7 \times 10^3$ micro-ohm-centimeters at room temperature to $3.4 \times 10^4$ micro-ohm-centimeters at 1000° C. For the 40 percent pyrophoric iron addition, the resistivity remains relatively low and varies from an extremely low $.9 \times 10^3$ micro-ohm-centimeters at room temperature to $2.1 \times 104$ micro-ohm-centimeters at 1000° C.

It is to be noted that the pure metal additions do not have to be in an uncombined state when added in powder form to the base material. For instance, the pure metals may be combined in the form of salts or oxides with the salts and oxides being reduced prior to the thorough mixing in powder form with the mixed-valence compounds. In order to eliminate the step of reducing the pure metal oxide prior to thorough mixing with the mixed-valence compound, as was the case in the formation of the thermoelectric material from ferrous oxide ($Fe_2O_3$), it was found possible simply blend the strontium titnate or other mixed-valence compound directly with ferric oxide ($Fe_3O_4$) with the reduction of the pure metal oxide occurring within the hydrogen atmosphere furnace.

Example 4

Specifically, three examples having end product pure metal composition percentages as follows:

Example 4*a*—w/o Fe 5%
Example 4*b*—w/o Fe 10%
Example 4*c*—w/o Fe 20%

In the manufacture of Example 4*a*, 6.91% w/o $Fe_3O_4$ was blended with 93.09% strontium titnate, the ferric oxide ($Fe_3O_4$) being in the powdered form and of one-half micron size. After blending in the manner of the above examples, the blended material was pressed into the desired element shape and a sample placed in a molybdenum boat and embedded in zirconium oxide sand. The element was stoked into a hydrogen atmosphere furnace at the desired stoking rate of one-half inch per minute, with the furnace at a temperature of 1430° C. to 1480° C. and the element was fired for a time period of 64 hours. The boat was then slowly stoked out of the furnace at a rate sufficient to prevent thermal cracking. Due to the hydrogen atmosphere, reduction of the 6.91% w/o $Fe_3O_4$ occurred, leaving a 5% w/o pure Fe additive to the strontium titnate. Significantly, the room temperature resistivity of Example 4*a* was .002895 ohm-cm. Examples 4*b* and 4*c* were carried out by means of the same general procedure.

For comparison purposes, the percentage of pure metal additive and the room temperature resistivity values of Examples 4*a*, 4*b*, and 4*c* are as follows:

| Examples | Additive | Room temp. resistivity (ohm-cm.) |
|---|---|---|
| 4a | 6.91% w/o $Fe_3O_4$=5% w/o Fe | .002895 |
| 4b | 13.82% w/o $Fe_3O_4$=10% w/o Fe | .002565 |
| 4c | 27.64% w/o $Fe_3O_4$=20% w/o Fe | .002220 |

It is interesting to note that in addition to achieving extremely low room temperature resistivity for the improved thermoelectric material, the need for prior reduction of the pure metal additive in the oxide form is eliminated due to the stoking of the sample into the hydrogen atmosphere furnace. It is also important to note that by this approach, the additive of the iron oxide can be considerably less than the other approaches in regard to effecting the room temperature resistivity. Significant reduction in room temperature resistivity for the other examples cited herein did not occur until an addition of the pure metal additive reached proportions of 10% or more. However, note for a 5% addition of pure metal additive in the form of iron of Example 4*a*, a relatively low room temperature resistivity of .002895 ohm-cm. resulted. It may be that the valence state of the sub-oxide surface on the final metal particles within the sintered element is such that the desired effect is more easily obtained using ferric oxide ($Fe_3O_4$) than by using pure pyrophoric iron.

From the above, it is readily apparent that the present invention provides improved thermoelectric materials and the method of forming the same consisting of mixed-valence compounds of the transition metals employing a pure metal additive. The electrical resistivity of these materials can be comparable to or may be less than that of intermetallic semiconductor thermoelectric elements while the Seebeck coefficient of the new materials remain comparable to that of previous oxide base thermoelectric elements. The new materials are capable of operation at temperatures much greater than the melting points of the intermetallic thermoelectric elements and are also free from volatization even near their maximum operating temperatures. The compressive strength, sheer strength, and mechanical shock resistance of the new materials are significantly greater than any known thermoelectric material heretofore developed for energy conversion application. While the pure metal addition in the examples of the present application has taken the form of iron powder, ready substitution may be made with other transition metals, such as nickel molybdenum, chromium and cobalt, while subtransition metals, such as tungsten, may be used. The iron is exemplary only of one type of pure metal which in powder form may be added to the mixed-valence compound base. Similarly, strontium titanate is exemplary of only one type of mixed-valence compound base which may be utilized and advantageous thermoelectric materials will be obtained using other similar base materials such as, for example, calcium titanate, lead titanate and barium titanate. The prime requirement is to effect compatibility between the pure metal additive and the matrix, which is principally accomplished by controlling the rate of stoking of the pressed element into the reducing atmosphere furnace which is preset at the desired sintering temperature.

While there have been shown and described and pointed out the fundamental novel features of the invention as applied to a preferred method and product produced thereby, it will be understood that various omissions and substitutions and changes in the form and details in the method and product illustrated may be made by those skilled in the art without departing from the spirit of the invention. It is the intention, therefore to be limited only as indicated by the scope of the following claims.

What is claimed is:

1. A high-temperature thermoelectric power generating device comprising an N-type thermoelectric element and a thermoelectric element of opposite conductivity type, said elements being electrically joined to form a thermoelectric couple, said N-type thermoelectric element having a room temperature resistivity no greater than .0225 ohm cm. comprised of a semiconductor cermet material having the formula:

$$ATiO_x+B$$

wherein A represents one element selected from the group consisting of calcium, strontium, lead, and barium, and $x$ is $<3>0$, and B represents a pure metal particle additive phase selected from the group consisting of iron, nickel, molybdenum, chromium, cobalt, and tungsten, in the metallic state.

2. The device of claim 1 wherein the element B constitutes between 5 and 40 weight percent of said cermet material.

3. A thermoelectric power generating device characterized by high-temperature operation with relatively low specific resistivity comprising an N-type thermoelectric element and a thermoelectric element of opposite conductivity type, said elements being electrically joined to form a thermoelectric couple, said N-type thermoelectric element comprised of a semiconductor cermet material having the formula:

$$ATiO_x+B$$

wherein A represents at least one element selected from the group consisting of calcium, strontium, lead, and barium, in the +2 valence state, and $x$ varies from $>0$ to $<3$, and B represents a compatible pure metal particle additive phase of one element selected from the group consisting of iron, nickel, molybdenum, chromium, cobalt, and tungsten.

4. A thermoelectric power generating device comprising an N-type thermoelectric element and a thermoelectric element of opposite conductivity type, said elements being electrically joined to form a thermoelectric couple, said N-type thermoelectric element having a room temperature resistivity of no greater than .0225 ohm cm. and comprising an N-type semiconductor cermet member consisting of a mixed valence compound selected from the group consisting of barium titanate, calcium titanate, strontium titanate, lead titanate and lead oxide and a pure metal particle additive phase selected from the group consisting of iron, nickel, molybdenum, chromium, cobalt and tungsten having a Seebeck voltage at 500° F. no less than about 40 millivolts.

References Cited

UNITED STATES PATENTS

| | | | |
|---|---|---|---|
| 2,852,400 | 9/1958 | Remeika | 106—39 |
| 3,056,938 | 11/1962 | Pappis et al. | 252—520 |
| 2,528,113 | 10/1950 | Carlson et al. | 252—520 X |
| 2,695,239 | 11/1954 | Oshry | 252—62.9 X |
| 2,941,192 | 6/1960 | Postal | 136—239 X |
| 2,961,554 | 11/1960 | Cook et al. | 252—62.9 X |
| 2,985,700 | 5/1961 | Johnston | 136—239 X |
| 3,013,977 | 12/1961 | Berman et al. | 252—62.9 |
| 3,037,180 | 5/1962 | Linz | 252—62.3 X |

FOREIGN PATENTS

| | | |
|---|---|---|
| 714,965 | 9/1954 | Great Britain. |

ALLEN B. CURTIS, Primary Examiner

U.S. Cl. X.R.

75—201, 211, 224; 252—62.3; 264—61